(12) United States Patent
Oberle et al.

(10) Patent No.: US 6,944,810 B2
(45) Date of Patent: Sep. 13, 2005

(54) METHOD AND APPARATUS FOR THE TESTING OF INPUT/OUTPUT DRIVERS OF A CIRCUIT

(75) Inventors: Hans-Dieter Oberle, Puchheim (DE); Sebastian Sattler, München (DE)

(73) Assignee: Infineon Technologies AG., Munich (DE)

( * ) Notice: Subject to any disclaimer, the term of this patent is extended or adjusted under 35 U.S.C. 154(b) by 457 days.

(21) Appl. No.: 10/213,728

(22) Filed: Aug. 6, 2002

(65) Prior Publication Data

US 2003/0030461 A1 Feb. 13, 2003

(30) Foreign Application Priority Data

Aug. 6, 2001 (DE) .......................... 101 38 556

(51) Int. Cl.⁷ .............................................. G01R 31/28
(52) U.S. Cl. ...................................... 714/733; 714/724
(58) Field of Search ........................ 377/70; 324/310, 324/158.1; 326/86; 323/288; 714/815, 733, 724

(56) References Cited

U.S. PATENT DOCUMENTS

| | | | | | |
|---|---|---|---|---|---|
| 4,495,628 | A | * | 1/1985 | Zasio ........................... | 377/70 |
| 4,587,480 | A | * | 5/1986 | Zasio ........................... | 324/310 |
| 5,256,964 | A | * | 10/1993 | Ahmed et al. ............ | 324/158.1 |
| 5,481,207 | A | * | 1/1996 | Crafts ........................... | 326/86 |
| 5,923,676 | A | | 7/1999 | Sunter et al. ............... | 371/22.5 |
| 6,005,407 | A | | 12/1999 | Arabi et al. ................ | 324/765 |
| 6,005,829 | A | | 12/1999 | Conn ........................... | 368/118 |
| 6,049,201 | A | * | 4/2000 | Feldtkeller .................. | 323/288 |
| 6,721,920 | B2 | * | 4/2004 | Rearick et al. ............. | 714/815 |

FOREIGN PATENT DOCUMENTS

| | | |
|---|---|---|
| DE | 100 24 476 | 12/2001 |
| JP | 09-257884 | 10/1997 |

OTHER PUBLICATIONS

IBM, Latch Oscillator, IBM technical Disclosure Bulletin, Sep. 1984.*
Arabi et al., Dynamic digital integrated circuit testing using oscillation–test method, Electronics Letters, vol. 34, No. 8, pp. 762–764 (Apr. 16, 1998).

* cited by examiner

*Primary Examiner*—David Ton
(74) *Attorney, Agent, or Firm*—Marshall, Gerstein & Borun LLP (57) ABSTRACT

In order to test the input and output drivers of a circuit, in particular an integrated semiconductor circuit, a method and apparatus is provided to connect the input or output drivers assigned to individual signal connections of the circuit to be tested in series to a ring oscillator or to an open chain with the oscillation of the ring oscillator or the delay time being evaluated. By providing appropriate controllable switches, the configuration of the ring oscillator or the chain can be altered variably depending on the input or output drivers to be tested respectively. In this way an "at-speed" and "leakage" test of all input and output drivers, including the external signal connections, are possible with all of these having to be connected to a rapid test unit.

45 Claims, 3 Drawing Sheets

METHOD AND APPARATUS FOR THE TESTING OF INPUT/OUTPUT DRIVERS OF A CIRCUIT

BACKGROUND

This disclosure relates to a method for testing input/output drivers for a circuit, and, in particular, testing of an integrated semiconductor circuit as well as a corresponding test device.

Generally speaking, for testing an integrated semiconductor circuit with n signal connections an automatic tester or a test device with n inputs and outputs is required. The automatic tester may apply test signals to the semiconductor circuit and subsequently measure and evaluate at a speed required by the respective test specimen (so-called "at-speed test"). The automatic tester is cheaper the fewer signal inputs and outputs are required and the lower the frequencies required for the test. Test methods are therefore sought on economic grounds which can be conducted using simple automatic testers with the fewest possible signals inputs and outputs and low frequencies.

Instead of costly function testing of digital circuits "at speed" using all the circuit signal connections, structural test methods are increasingly being used and are known by the names "scanpath" and "boundary scan", as examples, with only a few signal connections for the circuit to be tested needing to be contacted. In the case of the "scanpath" test method there is direct access to all sequential parts of the circuit to be tested, whereas with the "boundary scan" test method there is access to all internal logic circuit inputs and outputs. However, this method cannot yet establish whether the other non-contacted circuit signal connections can be routed outward free from error and function at the required speed (i.e., with this test method the functioning of all the various signal connections for allocated input and output drivers cannot be tested and whether their bond connections are free from error or not cannot be established). There is, therefore, the risk that errors in the input and output circuits of the semiconductor circuits to be tested are not discovered and that defective circuits may be delivered to customers under certain circumstances.

SUMMARY

According to an example, a method is provided for testing input/output drivers of a circuit, wherein the input/output drivers are assigned to corresponding signal connections of the circuit. The method includes connecting the input/output drivers to be tested in series such that an output of a first input/output driver is connected with an input of a following second input/output driver to form a ring oscillator. Additionally oscillation of the ring oscillator is evaluated in order to test the input/output drivers connected to the ring oscillator.

According to another example, a test device for testing input/output drivers of a circuit is provided, wherein the input/output drivers are assigned to corresponding signal connections of the circuit. The device includes a ring connecting the input/output drivers in series such that an output of a first input/output driver is connected with an input of a subsequent second input/output driver in order to form a ring oscillator. Additionally, an evaluation unit is provided to evaluate oscillation of the ring oscillator in order to test the input/out drivers connected to the ring oscillator.

DETAILED DESCRIPTION OF THE PREFERRED EXAMPLES

The presently disclosed examples provide a test method, as well as a corresponding test device, with which simple testing of all external signal connections, as well as the input and output drivers for a circuit for these signal connections is afforded.

Figure 1A:
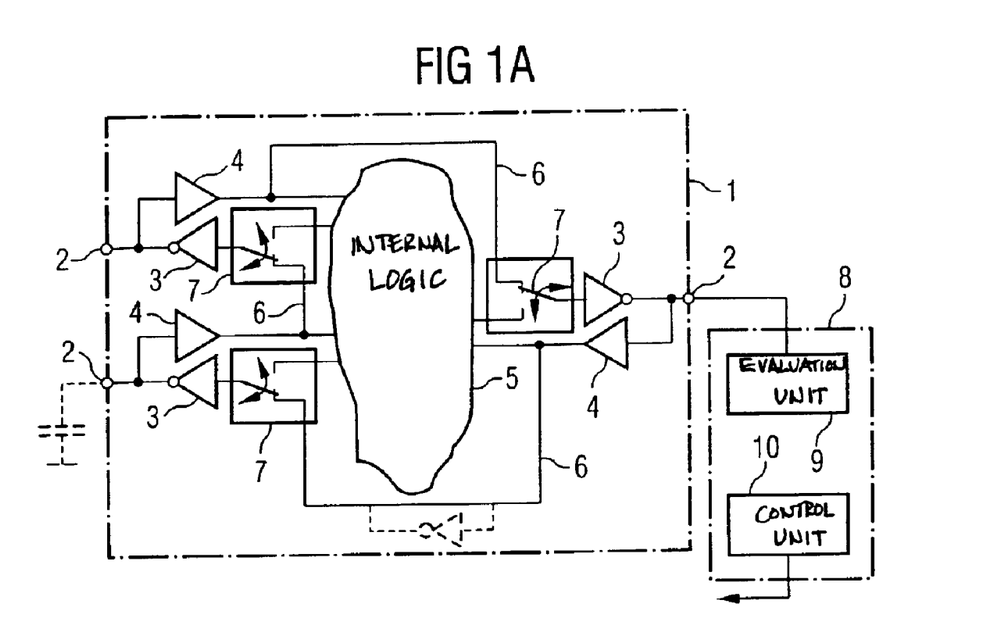
FIGS. 1A and 1B illustrate an integrated semiconductor circuit in test mode or in normal mode, respectively.

In FIG. 1A an integrated semiconductor circuit 1 with several signal connections or signal terminals 2 is shown, which are provided in addition to connections (not shown) for the supply voltage and for the ground connection. These signal connections 2 are either connected with output drivers 3 or input drivers 4 or, in the case of bi-directional connections, with output drivers 3 and input drivers 4 at the same time. In the example shown in FIGS. 1A and 1B, all the signal connections 2 are bi-directional connections, such that for each signal connection 2 both an output driver 3 as well as an input driver 4 is provided. With respect to these output drivers 3 and input drivers 4, and with the aid of an appropriate test unit 8, the logic function, speed or delay time may tested, and wherever possible under load, as well as the bond connection to the corresponding signal connections 2 or "pins" including the leakage behavior.

Figure 1B:
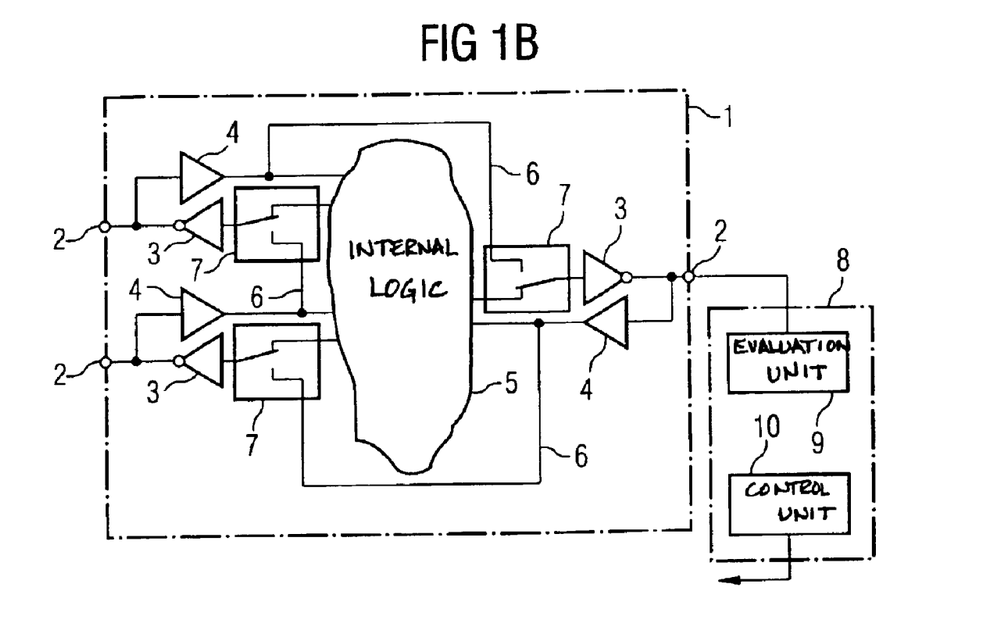

In normal mode the various output drivers 3 or input drivers 4 are switched with the aid of controllable change-over switches (multiplexers) 7 as shown in FIG. 1B in such a way that they are directly connected with the internal logic 5 of the respectively integrated semiconductor circuit 1. The circuit state of the change-over switch 7 is controlled by the test unit 8 or a control unit 10 provided inside it. Output signals of the internal logic 5 can therefore be tapped via the corresponding signal connection 2 with the aid of the corresponding output driver 3. Conversely, input signals can be supplied to the internal logic 5 via the corresponding signal connection 2 with the aid of the respective input drive 4.

In test mode, the change-over switches 7 are switched as shown in FIG. 1A. Here, by switching over the change-over switches 7 the various output drivers 3 or input drivers 4 are connected via internal connections 6 in series to form a ring, with one output of a driver 3 or 4 always connected to the input of a following driver 3 or 4. In the case of bi-directional signal connections 2, as shown in FIGS. 1A and 1B, this connection can be made internally in the integrated semiconductor circuit 1 (i.e., on the respective chip). In the case of unidirectional signal connections, to which are assigned respectively either only one output driver 3 or one input driver 4, the connection shown is realized for preference between the various drivers outside the respective chip, such as on the test board of the test unit 8 provided for testing integrated semiconductor circuit 1, for example.

Such a ring as described above represents a ring oscillator if an odd number of inverters are present in the ring. In the case of the specific example shown in FIG. 1A, the closed ring comprises three inverting output drivers 3 and three non-inverting input drivers 4, so that this criterion is met. If this criterion of an odd number of inverters in the ring is not met, on the other hand (e.g., if only non-inverting input drivers 4 or output drivers 3 are used as matter of principle), then an additional inverter (represented by broken lines in FIG. 1A) or inverting driver must be inserted in the ring connection 6 in order to test the integrated semiconductor circuit 1. This can be achieved, for example, in this case, by the test unit 8 switching the additional inverting driver into the ring connection 6 automatically. Likewise, the integrated semiconductor circuit 1 can be formed as early as the manufacturing stage in such a way that with an even number of the various signal connections 2 assigned to inverting output drivers 3 or input drivers 4 this additional inverting driver is provided in one of the connections 6 of the ring.

The ring oscillator formed in this way oscillates at a frequency whose period corresponds to double the overall delay time of all elements of the ring. By evaluating the oscillation of this ring oscillator it is therefore possible to test the external signal connections 2 of the integrated semiconductor circuit 1 or the output driver 3 and input driver 4 located in the ring including the change-over switches 7. To this end, the test unit 8 already mentioned is connected to one of the signal connections 2 with an evaluation unit 9. The evaluation unit 9 evaluates the oscillation of the ring oscillator. If no oscillation of the ring oscillator occurs, the evaluation unit 9 detects that the ring is either interrupted due to a defect or that one of the output drivers 3 or input drivers 4 is not exercising the corresponding and correct function. In the case of the specific example illustrated, the oscillation is evaluated externally in the evaluation unit 9 of the test unit 8. Evaluation of the oscillation is also possible of course within the integrated semiconductor circuit 1 in the form of a self-test.

As already mentioned, the oscillation period corresponds to double the sum of the delay times of all output drivers 3 and input drivers 4 which are present in the form of a series connection in the ring. The evaluation unit 9 of the test unit 8 can, therefore, detect by evaluating the oscillation period of the ring oscillator or by evaluating the oscillation frequency, by comparing with a particular specified limit value, for example, whether there are particularly slow drivers, 3, 4 or not with an unusually high delay time in the ring. Likewise, the function of the various output drivers 3 or input drivers 4 can be tested under load. To this end, the test unit 8 can automatically connect external load or line capacitances to the various signal connections 2, as shown by the broken lines in FIG. 1A. With such a capacitive load the delay time of the respective driver stage and, therefore, the ring oscillator period can be extended by a specified amount. More extensive delays in the oscillation period indicate weak drivers 3, 4. If the oscillation frequency or oscillation period remains unchanged, even if such an external load is connected to the respective signal connection 2 of the integrated semiconductor circuit 1, the evaluation unit 9 of the test unit 8 detects that the corresponding signal connection 2 or pin is not correctly connected internally.

In the simplest specific example, all output drivers 3 or input drivers 4 of the integrated semiconductor circuit 1 are interconnected in test mode to form a single, long ring as shown in FIG. 1A. In the case of integrated semiconductor circuits 1 with many signal connections 2 it may be desirable, however, to create several shorter rings independent of each other instead of one long ring. Care must be taken here again to ensure that the number of inverting drivers or inverting stages within each individual ring is odd, so that each individual ring forms a ring oscillator. The additional wiring 6 with the change-over switches 7 required for switching the output drivers 3 or input drivers 4 can largely be generated automatically within the integrated semiconductor circuit 1 by inserting these additional switching components automatically into the corresponding net list of the integrated semiconductor circuit 1 using software.

A simple method of evaluating the oscillation of the respective ring oscillator or of the corresponding oscillation period or oscillation frequency is including a universal frequency counter with a timer unit in the evaluation unit 9. In addition to this evaluation unit 9, the test unit 8 also comprises the control unit 10 already mentioned, which automatically generates the test sequence described above and ensures that in test mode the individual change-over switches 7 are switched as in FIG. 1A in order to obtain the desired ring structure. The control unit 10, therefore, automatically generates control or actuating signals for the individual, controllable change-over switches 7. Furthermore, the control unit 10 also provides for the automatic connection of an additional inverter that may be required or for the automatic connection of the load capacities described above to the individual signal connections 2, etc. The control signals can be transmitted or applied like the test signals (e.g., for a "boundary scan" test).

Figure 2A:
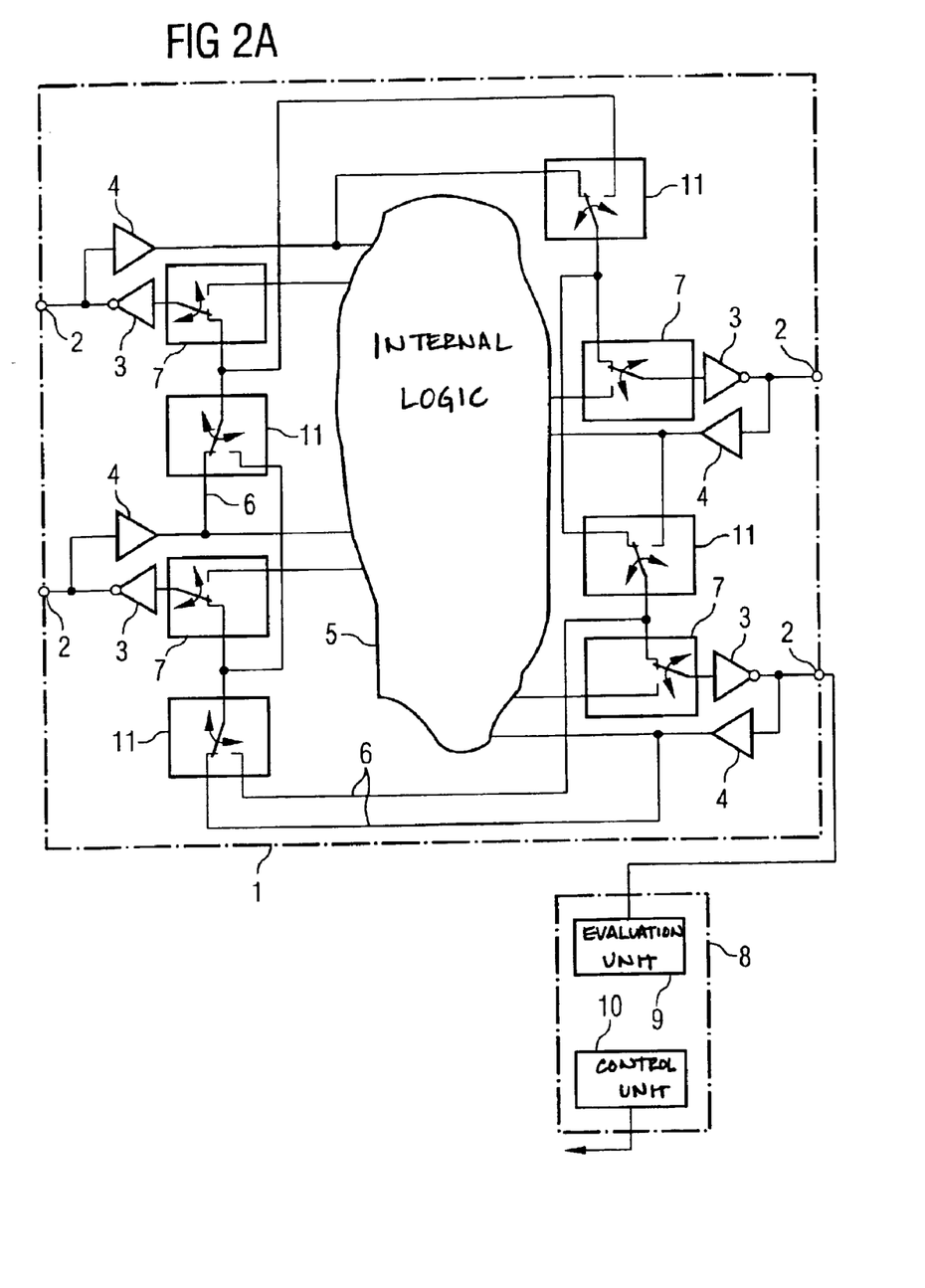
FIGS. 2A and 2B illustrate an integrated semiconductor circuit and a test device for testing the integrated semiconductor circuit in accordance with the present disclosure as well as a variant for conducting a "leakage" test.
Figure 2B:
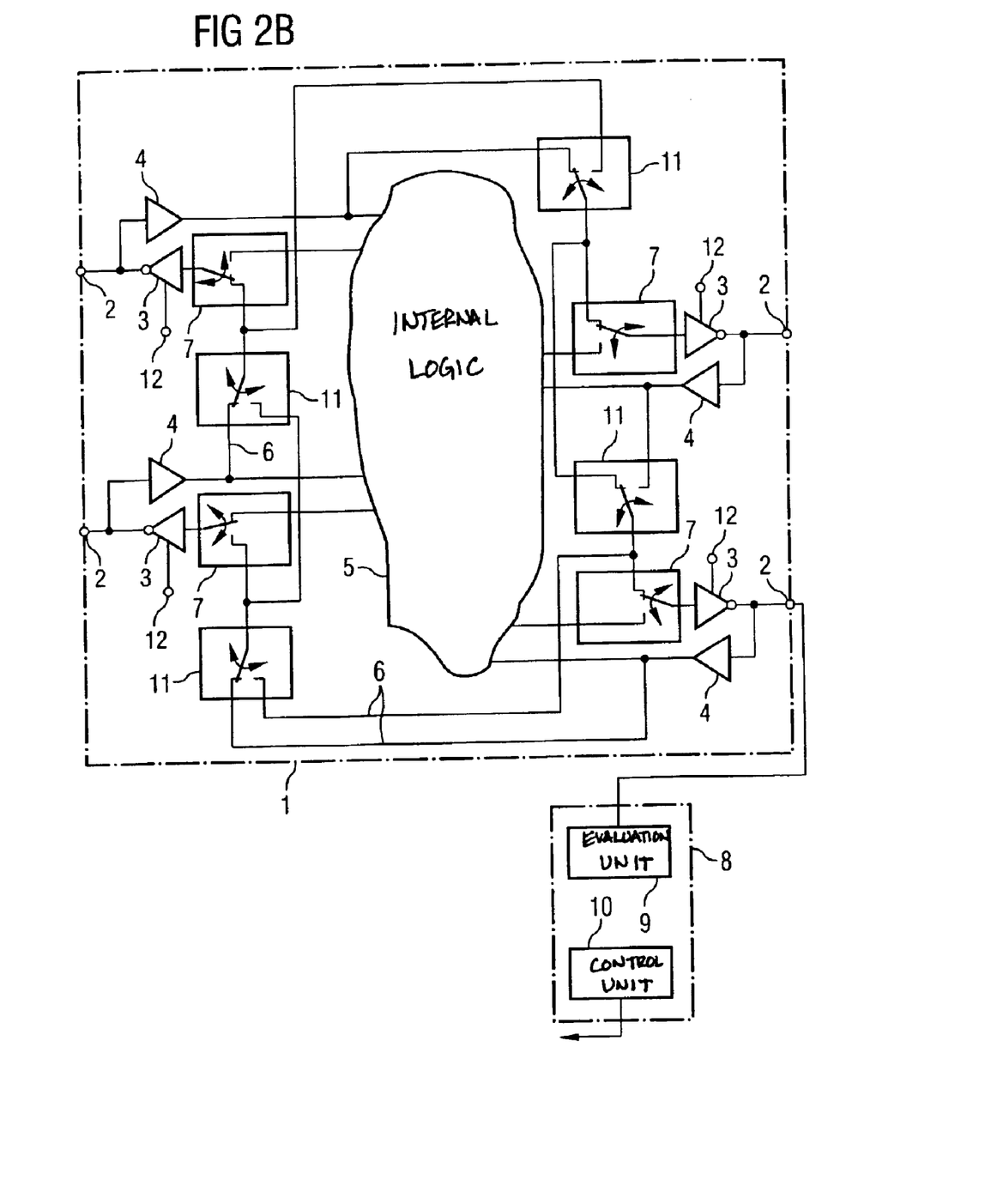

A further specific example is shown in FIG. 2A, which illustrates, like FIG. 1A, an integrated semiconductor circuit 1 with several signal connections 2 to which one output driver 3 and one input driver 4 are assigned, respectively. As in the specific example shown in FIGS. 1A and 1B, a change-over switch 7 is assigned to each signal connection 2, with the aid of which switching can be made between test mode and normal mode. In normal mode the various output drivers 3 or input drivers 4 are connected directly with the internal logic 5 of the integrated semiconductor circuit 1 as illustrated in FIG. 2B, whilst the change-over switches 7 are in the position shown in FIG. 2A during test mode, so that the individual output drivers 3 or input drivers 4 are connected in series with one another, as in the previously described example, to form a ring.

In contrast to the example described previously with respect to FIGS. 1A and 1B, however, a variable configuration of this ring is possible with the specific example shown in FIG. 2A. To this end, additional change-over switches or multiplexers 11 are provided with which the respectively preceding input/output driver combination or the corresponding signal connection 2 can be bridged. To this end, an input for this change-over switch 11 is connected with the output of a preceding input driver 4 and another input with the input of a corresponding, preceding output driver 3 or its corresponding change-over switch 7, whilst the output of the respective change-over switch 11 is, in turn, connected with an input of a following change-over switch 7. In the specific example shown in FIG. 2A and with the exception of the top right-hand signal connection 2 or the corresponding output driver 3 and the corresponding input driver 4 all other signal connections 2 are connected with the corresponding output drivers 3 and the corresponding input drivers 4 to form a ring oscillator with the number of inverting stages in this ring oscillator again being odd. The top right-hand signal connection 2 is bridged due to the circuit of the following change-over switch 11 (in the clockwise direction). The individual change-over switches 11 can be switched by the control unit 10 of the test unit 8, for example, with the "boundary scan" information assigned to the respective signal connection 2. Here, it is possible to assign a "boundary scan" register to each signal connection 2 for controlling the corresponding change-over switch 11 in order to be able to change the configuration of the ring oscillator during the test sequence.

In the specific example shown in FIG. 2A with variable configuration of the ring oscillator it is advantageous that each input/output driver pair can be activated and deactivated for the ring oscillator or switched on and off, so that the overall delay time of the corresponding input/output driver pair can be determined separately. For this, the input/output driver pair to be analyzed can be switched additionally into the ring or bridged during the test sequence. By evaluating the change in the ring oscillator oscillation period which then occurs, the test unit 8 or the corresponding evaluation unit 9 can infer the overall delay time of the input/output driver pair to be analyzed as this change in the oscillation period corresponds to double the overall delay time of the respective input/output driver pair and the corresponding change-over switch 7. The information that indicates whether the respective input/output driver pair is effective or bridged, can, as already mentioned, be stored in "boundary scan" registers, for example.

Furthermore, the example shown in FIG. 2A is therefore also advantageous, as a total even number of inverting stages within the ring an inverting stage or an inverting driver can be selectively bridged and tested in a second pass—another inverting stage then having to be bridged. The oscillation period of the ring oscillator evaluated by the test unit 8 is longer the more driver stages and change-over switches 7, 11 are connected to the ring. However, the detectability of additional delays of individual drivers is reduced as a result. The ring should not, therefore, be too long. In this connection, the example shown in FIGS. 2A and 2B offers the possibility of configuring various respectively short rings after one another and of conducting the evaluation internally or externally at one and the same point, at the lower right-hand signal connection 2, for example.

Finally, the leakage behavior of the signal connections 2, including the associated input drivers 4 and output drivers 3, can also be tested using the arrangement shown in FIG. 2A. For this, all input and output drivers 3, 4 are switched to form an open chain with the driver pair 3, 4 to be measured representing the start of the chain, respectively, with the evaluation unit 9 being connected to the end of the chain. An example of this is illustrated in FIG. 2B with the driver pair 3, 4 at the bottom left in FIG. 2B being tested. The corresponding output driver 3 is connected with the internal circuit logic 5 via the change-over switch 7 assigned to it with the ring open unlike FIG. 2A. Also shown in FIG. 2B are "enable" or release connections or terminals 12 for the individual output drivers 3 in order to switch these on and off selectively.

When testing the leakage behavior, the output driver 3 to be tested is initially switched to logic level "0", then to logic level "1" and, finally, via the release connection 12 to a high impedance state, with the control for this preferably being effected via internal circuit logic 5. From this point in time, the time span is measured at the evaluation unit 9 located at the end of the ring until the corresponding digital signal change can be detected after the output driver 3 is switched off. With an even number of inverting stages in the ring, logic level "0" is initially applied at the end of the ring, then logic level "1" and, after expiry of the discharge time to be measured, logic level "0" again. If the number of inverting stages is odd, the signal sequence at the end of the chain is inverted. Upon completion of the "leakage" test for the respective signal connection 2, the subsequent signal connection 2 is tested in the clockwise direction with the associated change-over switch 7 set for this so that the signal sequence described above is also switched by the internal circuit logic to the output driver 3 now to be tested. In this way all signal connections 2 for the integrated semiconductor circuit 1 can be tested, one after the other, separately for their leakage behavior. The whole of the testing period corresponds to the sum of all discharge times measured. To reduce the test time, the ring can also be sub-divided into several sections with a separate evaluation or time-measurement unit 9 provided at the end of each part-ring. With a "p" number of part-rings of such type and "p" number of separate evaluation units 9, the test time is therefore reduced by the factor "p".

Apart from a pure production test with minimal external connection of the integrated semiconductor circuit 1, the signals of all input drivers 4 or output drivers 3 can also be observed from the outside, using an oscilloscope, for example, for the purposes of analysis.

In all, with the aid of the disclosed apparatus and method described above using few signals inside and outside the integrated semiconductor circuit 1 to be tested, the correct functioning of all input drivers 4 and all output drivers 3, including the connection to the respective signal connections 2, can be tested. With the optional connection or separation of individual input drivers 4 or output drivers 3, their delay times can be determined individually during the test. Adequate testing of all the integrated semiconductor circuit 1 between the external signal connections 2 and the internal circuit logic 5 is therefore guaranteed. The additionally required circuit measures (change-over switches 7 and 11 as well as wiring 6) can be simply inserted in the corresponding network list using software for example when the corresponding integrated semiconductor circuit 1 is designed, and this possibly automated in the same step when the circuit is inserted for the "boundary scan" method.

As disclosed above, input or output drivers for a circuit to be tested (especially in the form of an integrated semiconductor circuit) are interconnected in a ring such that the output of an input or output driver is connected respectively with the input of a following input/output driver. Such a ring represents a ring oscillator, if an odd number of inverters exist in the ring. If only non-inverting input/output drivers are used, an additional inverter must be inserted in the ring for testing. The ring oscillator thus formed oscillates on a frequency whose period of oscillation corresponds to double the overall delay time of all elements of the ring. By evaluating the oscillation which occurs in this ring oscillator the function, the bond connection or the delay time of each input/output driver can be tested or measured. Such a ring oscillator oscillation does not occur, namely, if the ring is interrupted as the result of a defect or an input/output driver does not possess the corresponding function. Furthermore, slow input/output drivers can be recognized, if the period of the oscillation exceeds a particular limit value or the frequency of the oscillation undershoots a particular limit value. By externally loading the various signal connections of the circuit, in the form of line capacities for example, the function of the various input/output drivers can be tested under load. If the frequency of the oscillation of the ring oscillator remains unchanged even after connection of such an external load to the corresponding signal terminal, this indicates a signal terminal or pin that is not connected internally.

The frequency of the disclosed ring oscillator can be evaluated both inside the circuit to be tested as well as externally in the corresponding automatic tester or in the corresponding test device and all the signal connections or signal terminals can only be evaluated at one signal terminal.

The input and output drivers for the circuit to be tested can be connected together to form one long or several shorter rings in test mode. In accordance with one of the disclosed examples, the various input/output drivers may, however, be inserted in a ring as an option, by appropriate programming, for example. This variant is, therefore, particularly advantageous as with an overall even number of inverters inside the ring a single inverter can be bridged and tested in a second pass with another inverter being bridged. Furthermore, with the aid of this variant various respectively short rings can be configured and the evaluation effected internally or externally on one and the same place or at one and the same signal connection. The overall delay time for each driver stage pair can also be determined as with this specific example each driver stage pair (for bi-directional signal connections) can be switched on and off separately.

If the ring formed in the way and method described above is not closed, but only forms a chain of the input/output drivers up to a test or evaluation device, the leakage behavior of the various signal connections is tested one after the other, with a pre-defined digital signal change being caused at the signal connection to be tested respectively at the start of the chain and then the corresponding driver being switched to a high-impedance state ("tristate") and at the end of the chain the time up until the occurrence or detection of the corresponding digital signal change being measured, this time representing a dimension for the leakage current at the appropriate signal connection. In this way all the circuit signal connections can be tested for leakage current one after the other.

The disclosed methods and apparatus permit an "at-speed" test of all input and/or output drivers (IO drivers) of a circuit, in particular of an integrated semiconductor circuit, including the corresponding bond connections. As already explained, characterization of each input/output driver pair individually is possible as well as testing under load and testing of leakage behavior. Evaluation can be effected both "on chip", as well as externally, with only limited additional expenditure. An automatic tester with many rapid test channels for all digital circuit signal connections is not required which is especially important as for testing the internal functions of semiconductor circuits such complex testers can largely be dispensed with. This disclosed apparatus and method supplement the known "scanpath" and "boundary scan" test methods for testing the internal circuit logic with the test for testing pad circuits with input/output drivers, so that, from now on, the whole of the semiconductor circuit including the external signal connections can be adequately tested.

The disclosed apparatus and methods are suitable for testing the external signal connections of integrated semiconductor circuits. Of course, these disclosed methods and apparatus are not restricted to this application, but can be used anywhere where testing of the input/output drivers of a circuit is desirable. Here, the term "input/output driver" is to be understood as both pure input or output drivers as well as, in the case of bi-directional signal connections, input/output driver pairs.

Although certain methods and apparatus in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A method for testing input/output drivers of a circuit, wherein the input/output drivers are assigned to corresponding signal connections of the circuit, the method comprising:
   connecting the input/output drivers to be tested in series such that an output of a first input/output driver is connected with an input of a following second input/output driver to form a ring oscillator, the connecting including:
      interconnecting the individual input/output drivers inside the circuit when both an output driver and an input driver of each respective input/output driver are assigned as bi-directional signal connections of the circuit,
      interconnecting the input/output drivers outside the circuit when the respective input drivers and output drivers of the input/output drivers are assigned as unidirectional signal connections; and
   evaluating oscillation of the ring oscillator in order to test the input/output drivers connected to the ring oscillator.

2. A method according to claim 1, further comprising:
   testing the input/output drivers of the circuit wherein the first and second input/output drivers are connected to a first ring oscillator;
   connecting third and fourth input/output drivers to a second ring oscillator;
   evaluating oscillation of the individual first and second ring oscillators separately.

3. A method according to claim 1, wherein the input/output drivers are interconnected such that a number of inverting input/output drivers in the ring oscillator is an odd number.

4. A method according to claim 1, further comprising:
   connecting an additional inverting driver in the ring oscillator when a number of inverting input/output drivers in the ring oscillator is initially an even number that are assigned to the signal connections of the circuit.

5. A method according to claim 1, further comprising:
   testing an individual input/output driver by one of connecting the individual input/output driver into the ring oscillator or disconnecting the individual input/output driver from the ring oscillator; and
   wherein evaluating oscillation in the ring oscillator includes evaluating a subsequent change occurring in the ring oscillator oscillation after either connecting or disconnecting the individual input/output driver.

6. A method according to claim 1, wherein when no ring oscillator oscillation can be detected after connecting the input/output drivers to the ring oscillator, a defect in the ring oscillator wiring or at least one defective input/output driver in the ring oscillator is concluded therefrom.

7. A method according to claim 1, further comprising:
   switching a load to a particular signal connection for testing the particular signal connection of the circuit; and
   determining too low driver performance of an input/output driver associated with the particular signal connection when a change in a ring oscillator frequency period is above a specified limit value after the load is connected.

8. A method according to claim 1, further comprising:
   determining a delay time of the input/output drivers connected to the ring oscillator by evaluating a ring oscillator oscillation period.

9. A method according to claim 8, further comprising:
   connecting a load to a particular signal connection of the circuit for testing the particular signal connection; and
   determining that a defective internal connection of the particular signal connection exists once an unchanged ring oscillator oscillation period is established after connecting the load.

10. A method according to claim 8, further comprising:
    testing an individual input/output driver by one of connecting the individual input/output driver into the ring oscillator or disconnecting the individual input/output driver from the ring oscillator; and
    wherein evaluating oscillation in the ring oscillator includes evaluating a subsequent change occurring in the ring oscillator oscillation after either connecting or disconnecting the individual input/output driver.

11. A method according claim 1, further comprising:
    testing leakage behavior of a particular signal connection of the circuit including:

connecting input/output drivers of the particular signal connection in series with an open chain;

applying a pre-defined signal to the particular signal connection to be tested; and evaluating signals appearing at an end of the open chain in order to test the leakage behavior of the particular signal connection.

12. A method according to claim 11, wherein testing the leakage behavior includes switching an output driver assigned to the particular signal connection and contained in the open chain to an initial signal level and then to a second signal level and finally to a high-impedance state; measuring a time period from switching to the high impedance state until a signal change corresponding to the change in the high-impedance state of the output driver occurs at the end of the chain; and determining the leakage behavior based on the measured time period.

13. A test device for testing input/output drivers of a circuit, wherein the input/output drivers are assigned to corresponding signal connections of the circuit, the device comprising:

a ring connecting the input/output drivers in series such that an output of a first input/output driver is connected with an input of a subsequent second input/output driver in order to form a ring oscillator, the individual input/output drivers being interconnected inside the circuit when both an output driver and an input driver of each respective input/output driver are assigned as bi-directional signal connections of the circuit, interconnecting the input/output drivers being interconnected outside the circuit when the respective input drivers and output drivers of the input/output drivers are assigned as unidirectional signal connections; and an evaluation unit to evaluate oscillation of the ring oscillator in order to test the input/output drivers connected to the ring oscillator.

14. A test device according to claim 13, wherein the ring includes a first controllable switch and the device further includes a control unit to control the first controllable switch such that the input/output drivers are connected in series by the first controllable switch in the ring oscillator.

15. A test device according to claim 14, further comprising a second controllable switch to connect individual input/output drivers to the ring oscillator when required or to separate individual input/output drivers from the ring oscillator when required.

16. A test device according to claim 14, wherein the first controllable switch is further configured to connect the input/output drivers to an open chain circuit for testing the leakage behavior at the corresponding signal connections.

17. A test device according to claim 16, wherein each output driver includes a release connection for selectively switching the output driver on and off.

18. A circuit capable of being tested by a test method that tests input/output drivers of the circuit, the circuit comprising:

a plurality of input/output drivers, each of the drivers assigned to corresponding signal connections; and a connection circuit configured to connect the plurality of input/output drivers in series such that an output of a first input/output driver is connected with an input of a subsequent input/output driver in order to form a ring oscillator, the individual input/output drivers being interconnected inside the circuit when both an output driver and an input driver of each respective input/output driver are assigned as bi-directional signal connections of the circuit, interconnecting the input/output drivers being interconnected outside the circuit when the respective input drivers and output drivers of the input/output drivers are assigned as unidirectional signal connections.

19. A circuit according to claim 18, wherein the connecting circuit includes controllable switches to connect individual input/output drivers of the plurality to the ring oscillator when desired or disconnect individual input/output drivers of the plurality from the ring oscillator when desired in order to test the input/output drivers.

20. A circuit according to claim 18, wherein the circuit is an integrated semiconductor circuit.

21. A circuit according to claim 18, wherein the circuit is configured to evaluate oscillation of the ring oscillator in order to test the plurality input/output drivers connected to the ring oscillator.

22. A circuit according to claim 18, wherein the circuit includes a controllable switch to connect one or more of the plurality of input/output drivers to an open chain circuit for testing the leakage behavior at corresponding signal connections.

23. A circuit according to claim 22, wherein each output driver of each input/output driver of the plurality includes a release connection for selectively switching the output driver on and off.

24. A method for testing input/output drivers of a circuit, wherein the input/output drivers are assigned to corresponding signal connections of the circuit, the method comprising:

connecting the input/output drivers to be tested in series such that an output of a first input/output driver is connected with an input of a following second input/output driver to form a ring oscillator;

evaluating oscillation of the ring oscillator in order to test the input/output drivers connected to the ring oscillator; and testing an individual input/output driver by one of connecting the individual input/output driver into the ring oscillator or disconnecting the individual input/output driver from the ring oscillator, wherein evaluating oscillation of the ring oscillator includes evaluating a subsequent change occurring in the ring oscillator oscillation after either connecting or disconnecting the individual input/output driver.

25. A method according to claim 24, wherein connecting the input/output drivers further comprises:

interconnecting the individual input/output drivers inside the circuit when both an output driver and an input driver of each respective input/output driver are assigned as bi-directional signal connections of the circuit; and interconnecting the input/output drivers outside the circuit when the respective input drivers and output drivers of the input/output drivers are assigned as unidirectional signal connections.

26. A method according to claim 24, further comprising:

testing the input/output drivers of the circuit wherein the first and second input/output drivers are connected to a first ring oscillator;

connecting third and fourth input/output drivers to a second ring oscillator;

evaluating oscillation of the individual first and second ring oscillator separately.

27. A method according to claim 24, wherein the input/out drivers are interconnected such that a number of inverting input/output drivers in the ring oscillator is an odd number.

28. A method according to claim 24, further comprising:
connecting an additional inverting driver in the ring oscillator when a number of inverting input/output drivers in the ring oscillator is initially an even number that are assigned to the signal connections of the circuit.

29. A method according to claim 24, wherein when no ring oscillator oscillation can be detected after connecting the input/output drivers to the ring oscillator, a defect in the ring oscillator wiring or at least one defective input/output drive in the ring oscillator is concluded therefrom.

30. A method according to claim 24, further comprising:
switching a load to a particular signal connection for testing the particular signal connection of the circuit; and
determining too low driver performance of an input/output driver associated with the particular signal connection when a change in a ring oscillator frequency period is above a specified limit value after the load is connected.

31. A method according to claim 24, further comprising:
determining a delay time of the input/output drivers connected to the ring oscillator by evaluating a ring oscillator oscillation period.

32. A method according to claim 31, further comprising:
connecting a load to a particular signal connection of the circuit for testing the particular signal connection; and
determining that a defective internal connection of the particular signal connection exists once an unchanged ring oscillator oscillation period is established after connecting the load.

33. A method according claim 24, further comprising:
testing leakage behavior of a particular signal connection of the circuit including:
connecting input/output drivers of the particular signal connection in series with an open chain;
applying a pre-defined signal to the particular signal connection to be tested; and
evaluating signals appearing at an end of the open chain in order to test the leakage behavior of the particular signal connection.

34. A method according to claim 33, wherein testing the leakage behavior includes switching an output driver assigned to the particular signal connection and contained in the open chain to an initial signal level and then to a second signal level and finally to a high-impedance state; measuring a time period from switching to the high impedance state until a signal change corresponding to the change in the high-impedance state of the output driver occurs at the end of the chain; and determining the leakage behavior based on the measured time period.

35. A test device for testing input/output drivers of a circuit, wherein the input/output drivers are assigned to corresponding signal connections of the circuit, the device comprising:
a ring connecting the input/output drivers in series such that an output of a first input/output driver is connected with an input of a subsequent second input/output driver in order to form a ring oscillator; and
an evaluation unit to evaluate oscillation of the ring oscillator in order to test the input/output drivers connected to the ring oscillator,
a control unit either to connect an individual input/output driver into the ring or to disconnect the individual input/output driver from the ring,
the evaluation unit to evaluate a subsequent change occurring in the ring oscillation after either connecting or disconnecting the individual input/output driver.

36. A test device according to claim 35, wherein the ring includes a first controllable switch and the control unit controls the first controllable switch such that the input/output drivers are connected in series by the first controllable switch in the ring oscillator.

37. A test device according to claim 36, further comprising
a second controllable switch to connect individual input/output drive to the ring oscillator when required or to separate individual input/output drivers from the ring oscillator when required.

38. A test device according to claim 36, wherein the first controllable switch is further configured to connect the input/output drivers to an open chain circuit for testing the leakage behavior at the corresponding signal connections.

39. A test device according to claim 38, wherein each output driver includes a release connection for selectively switching the output driver on and off.

40. A circuit capable of being tested by a test method that tests input/output drivers of the circuit, the circuit comprising:
a plurality of input/output drivers, each of the drivers assigned to corresponding signal connections; and
a connection circuit configured to connect the plurality of input/output drivers in series such that an output of a first input/output driver is connected with an input of a subsequent input/output driver in order to form a ring oscillator,
the connection circuit configured to connect the individual input/output driver into the ring oscillator or to disconnect the individual input/output driver from the ring oscillator; and
wherein evaluating oscillation in the ring oscillator includes evaluating a subsequent change occurring in the ring oscillator oscillation after either connecting or disconnecting the individual input/output driver.

41. A circuit according to claim 40, wherein the connecting circuit includes controllable switches to connect individual input/output drivers of the plurality to the ring oscillator when desired or disconnect individual input/output drivers of the plurality from the ring oscillator when desired in order to test the input/output drivers.

42. A circuit according to claim 40, wherein the circuit is integrated semiconductor circuit.

43. A circuit according to claim 40, wherein the circuit is configured to evaluate oscillation of the ring oscillator in order to test the plurality input/output drivers connected to the ring oscillator.

44. A circuit according to claim 40, wherein the circuit includes a controllable switch to connect one or more of the plurality of input/output drivers to an open chain circuit for testing the leakage behavior at corresponding signal connections.

45. A circuit according to claim 44, wherein each output driver of each input/output driver of the plurality includes a release connection for selectively switching the output driver on and off.

* * * * *

UNITED STATES PATENT AND TRADEMARK OFFICE
CERTIFICATE OF CORRECTION

PATENT NO. : 6,944,810 B2
DATED : September 13, 2005
INVENTOR(S) : Hans-Dieter Oberle et al.

It is certified that error appears in the above-identified patent and that said Letters Patent is hereby corrected as shown below:

Column 11,
Line 1, "input/out" should be -- input/output --; and
Line 13, "drive" should be -- driver --.

Column 12,
Line 15, "drive" should be -- drivers --.

Signed and Sealed this

Twenty-eighth Day of March, 2006

JON W. DUDAS
*Director of the United States Patent and Trademark Office*